(12) United States Patent
Wu et al.

(10) Patent No.: US 10,879,097 B2
(45) Date of Patent: Dec. 29, 2020

(54) MODULAR PRESSING DEVICE CAPABLE OF GENERATING STAGE DOWNWARD FORCES AND ELECTRONIC DEVICE TESTING APPARATUS COMPRISING THE SAME

(71) Applicant: CHROMA ATE INC., Taoyuan (TW)

(72) Inventors: Chi-Chen Wu, Taoyuan (TW); Yun-Jui Cheng, Taoyuan (TW); Chien-Ming Chen, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 428 days.

(21) Appl. No.: 15/903,228

(22) Filed: Feb. 23, 2018

(65) Prior Publication Data
US 2019/0172740 A1    Jun. 6, 2019

(30) Foreign Application Priority Data

Dec. 4, 2017   (TW) .............................. 106142342 A (51) Int. Cl.
| | |
|---|---|
| *H01L 21/673* | (2006.01) |
| *G01R 1/04* | (2006.01) |
| *H01R 13/629* | (2006.01) |
| *B30B 15/00* | (2006.01) |
| *H01L 21/677* | (2006.01) |
| *H01L 23/32* | (2006.01) |
| *B21D 43/05* | (2006.01) |
| *G01R 31/28* | (2006.01) |

(52) U.S. Cl.
CPC ........ *H01L 21/67356* (2013.01); *B21D 43/05* (2013.01); *B30B 15/0052* (2013.01); *G01R 1/0425* (2013.01); *G01R 31/2891* (2013.01); *H01L 21/6773* (2013.01); *H01L 23/32* (2013.01); *H01R 13/629* (2013.01)

(58) Field of Classification Search
CPC ........... H01L 21/67356; H01L 21/6773; H01L 23/32; G01R 31/2891; G01R 1/0425; H01R 13/629; B30B 15/0052; B21D 43/05
USPC ....................................... 324/750.01; 439/64
See application file for complete search history.

(56) References Cited

U.S. PATENT DOCUMENTS

| | | | | |
|---|---|---|---|---|
| 7,679,362 B2 * | 3/2010 | Koski | ................ | H03K 17/9505 324/207.2 |
| 2012/0208381 A1 * | 8/2012 | Garcia | ............... | G01R 1/06716 439/64 |

* cited by examiner

*Primary Examiner* — Farhana A Hoque
(74) *Attorney, Agent, or Firm* — Muncy, Geissler, Olds & Lowe, P.C.

(57) ABSTRACT

A modular pressing device capable of generating stage downward forces is provided. The modular pressing device comprises a non-exchangeable pressing module and an exchangeable pressing module. The non-exchangeable pressing module includes a first downward force generating unit. The exchangeable pressing module includes a second downward force generating unit. The first downward force generating unit applies a first downward force to at least one of a testing seat and an electronic device through the exchangeable pressing module. The second downward force generating unit applies a second downward force to the electronic device. Thereby, the modular pressing device is capable to generate two different downward forces to reduce the downward surge force. In addition, as the exchangeable pressing module is worn, the exchangeable pressing module can be replaced quickly such that the maintenance cost can be effectively reduced and the stability of the apparatus can be enhanced.

9 Claims, 5 Drawing Sheets

MODULAR PRESSING DEVICE CAPABLE OF GENERATING STAGE DOWNWARD FORCES AND ELECTRONIC DEVICE TESTING APPARATUS COMPRISING THE SAME

BACKGROUND OF INVENTION

1. Field of the Invention

The present invention is related to a modular pressing device capable of generating stage downward forces, and more particularly is related to a modular pressing device utilized for pressing the electronic device against the testing apparatus to facilitate the testing of the electronic device.

2. Description of the Prior Art

The pressing device of the conventional electronic device testing apparatus features the lift arm to press the electronic device directly. However, as the electronic device has been placed in the testing seat and the lift arm presses again, a downward surge force would be generated. The so-called downward surge force refers to a downward force which rises and falls in an instant. The downward surge force may excess 2~3 times of the rated downward force applied to the electronic device to be tested.

However, such a great downward force in a sudden would induce a great challenge to high-precision chips. The great downward force may break the chips directly, but it is even a bigger worry to form the potential cracks which are not visible from the outside. After being used by the end users for a while, the potential cracks may cause abnormal functions during the operation so as to affect the efficiency and the life time of the chips.

In an earlier patent application of the inventor, i.e. U.S. patent application Ser. No. 15/841,626, with the title of "ELECTRONIC DEVICE PRESSING DEVICE WITH STAGE DOWNWARD FORCES", the issue of downward surge force generated in the conventional pressing device has been resolved. However, when the pressing device is worn or a different electronic device is installed, it is necessary to re-adjust the pressing device and test the downward force to be applied to the electronic device before the operation. Thus, an electronic device pressing device easy to be disassembled, installed, and capable of providing stage downward forces is urgent in the industry.

SUMMARY OF THE INVENTION

It is a main object to the present invention to provide a modular pressing device capable of generating stage downward forces to resolve the problem of the downward surge force by providing stage downward forces of different levels, and is easy to be disassembled and installed.

According to an embodiment, a modular pressing device capable of generating stage downward forces is provided in the present invention. The modular pressing device comprises a non-exchangeable pressing module and an exchangeable pressing module. The non-exchangeable pressing module is disposed on an electronic device testing apparatus, and includes a first downward force generating unit. The exchangeable pressing module is assembled to the non-exchangeable pressing module, and includes a second downward force generating unit. The first downward force generating unit applies a first downward force to at least one of a testing seat and an electronic device through the exchangeable pressing module, and the second downward force generating unit applies a second downward force to the electronic device.

According to another embodiment, a modular pressing device capable of generating stage downward forces is provided in the present invention. The modular pressing device comprises a non-exchangeable pressing module and an exchangeable pressing module. The non-exchangeable pressing module comprises a first downward force generating unit and a second downward force generating unit. The exchangeable pressing module is assembled to the non-exchangeable pressing module and includes a chip pick-and-place bar. The chip pick-and-place bar is connected to the second downward force generating unit. The first downward force generating unit applies a first downward force to at least one of a testing seat and an electronic device through the exchangeable pressing module, and the second downward force generating unit applies a second downward force to the electronic device through the chip pick-and-place bar.

BRIEF DESCRIPTION OF THE DRAWINGS

The present invention will now be specified with reference to its preferred embodiment illustrated in the following drawings.

DESCRIPTION OF THE PREFERRED EMBODIMENT

The specific structural and functional details disclosed herein are only representative and are intended for describing exemplary embodiments of the disclosure. It is noted that, in the disclosure, similar elements would be represented by the same labels. Moreover, the drawings are for the purpose of illustration. The drawings may not be drawn based on precise proportions, and the drawing may not contain all the details.

Figure 1:
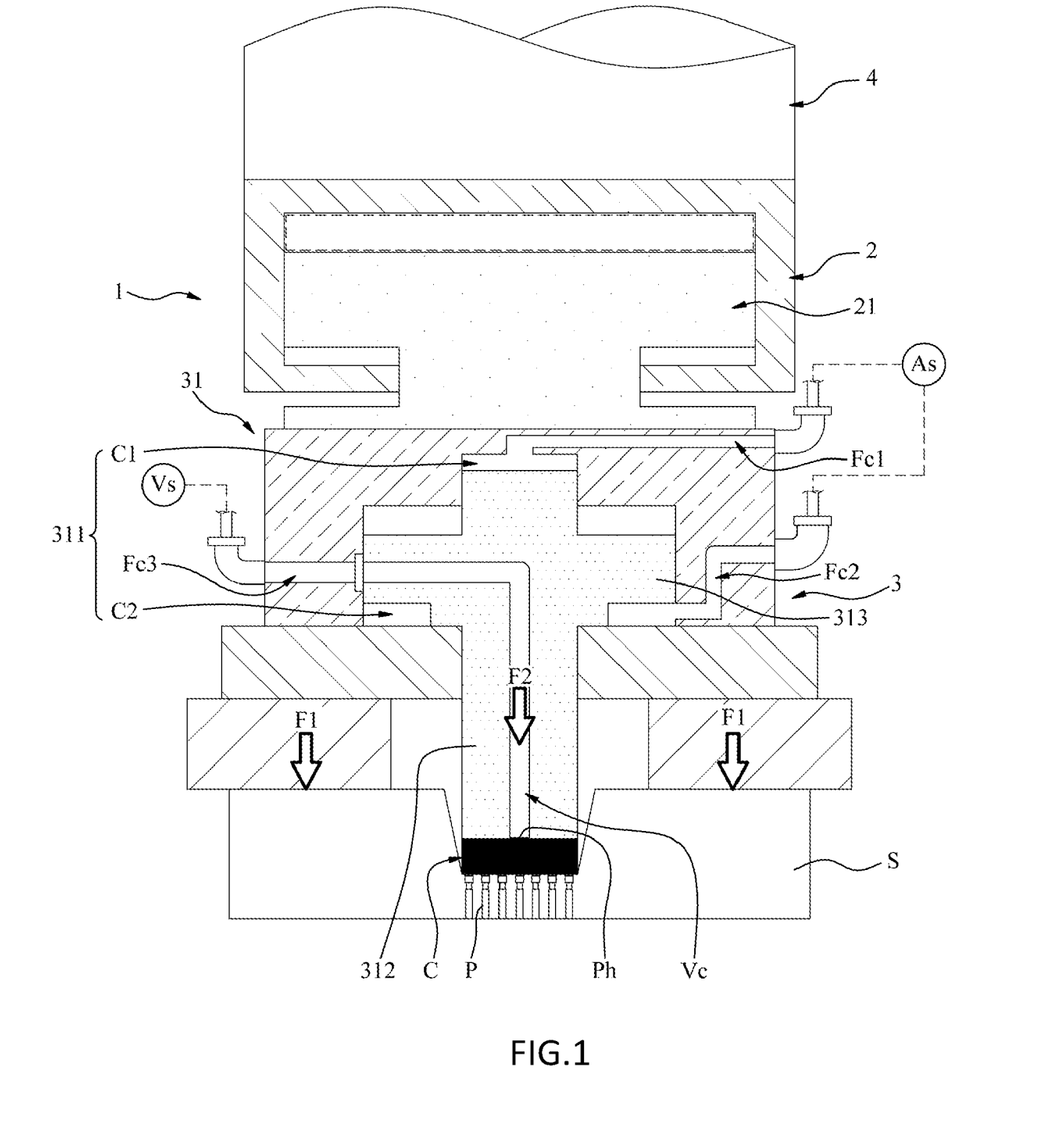
FIG. 1 is a schematic cross-section view of the electronic device testing apparatus provided in accordance with a preferred embodiment of the present invention.
Figure 2:
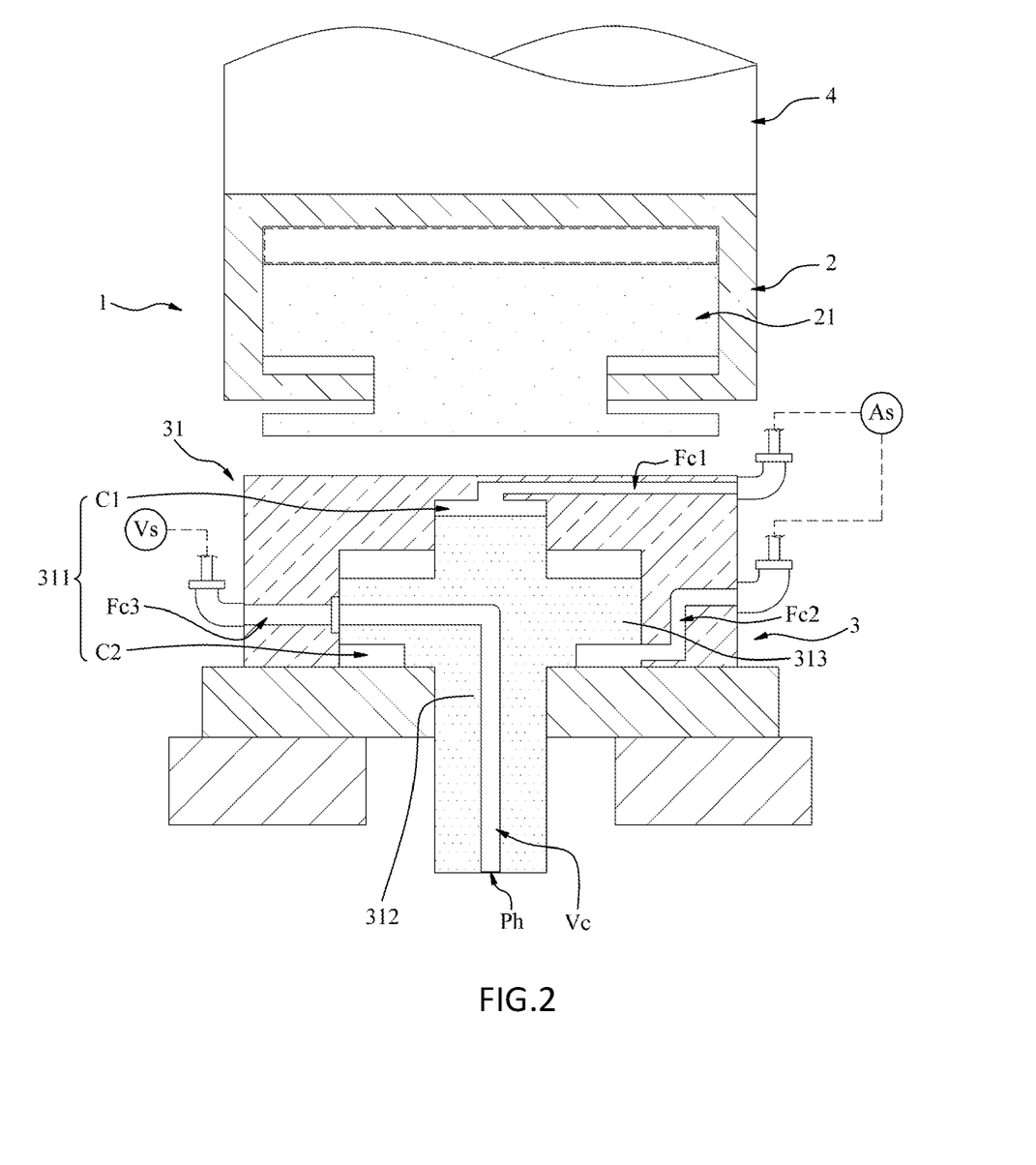
FIG. 2 is a schematic cross-section view of the modular pressing device capable of generating stage downward forces provided in accordance with a first embodiment of the present invention.

Please refer to FIG. 1 and FIG. 2, wherein FIG. 1 is a schematic cross-section view of the electronic device testing apparatus provided in accordance with a preferred embodiment of the present invention, and FIG. 2 is a schematic cross-section view of the modular pressing device capable of generating stage downward forces provided in accordance with a first embodiment of the present invention. As shown, the electronic device testing apparatus includes a load carrying device 4, a modular pressing device 1, and a testing seat S. The modular pressing device 1 is disposed on the load carrying device 4. The load carrying device 4 is capable to move a load along three dimensions in space, that is, the load carrying device 4 is capable to carry the modular pressing device 1 along three dimensions in space to facilitate carrying, picking, and placing movements for the electronic device C before and after the testing. In addition, the testing seat S is utilized for placing and testing the electronic device C.

Moreover, in addition to picking and placing movements for the electronic device C, the modular pressing device 1 provided in the present embodiment is also utilized for pressing the electronic device C to have the electronic device C electrically contact the plural probes P of the testing seat S. The electronic device testing apparatus provided in the present embodiment is mainly adopted for testing a typical chip, a.k.a. a die or a semiconductor IC, before being placed on a printed circuit board, however, the present invention is not limited thereto. The electronic device testing apparatus provided in the present invention can also be used for testing the chips before or after packaging.

As shown in FIG. 2, the modular pressing device 1 includes a non-exchangeable pressing module 2 and an exchangeable pressing module 3. The non-exchangeable pressing module 2 is disposed on the load carrying device 4, and includes a first downward force generating unit 21. The first downward force generating unit 21 can be an air damper or an oil damper, which is capable to adjust the downward force. The first downward force generating unit 21 provided in the present embodiment is characterized as to generate a steady force output after being compressed by a half of the stroke. Thereby, the first downward force F1 generated by the first downward force generating unit 21 of the present embodiment is defined as the downward force generated when the load carrier device 4 moving downward to compress the first downward force generating unit 21 by a half of the damper stroke substantially.

In addition, the exchangeable pressing module 3 is assembled under the non-exchangeable pressing module 2, and includes a second downward force generating unit 31. The second downward force generating unit 31 provided in the present embodiment includes a fluid chamber 311 and a pressing bar 312. The pressing bar 312 includes a piston head 313. The piston head 313 is disposed in the fluid chamber 311 to divide the fluid chamber 311 into a first fluid chamber C1 and a second fluid chamber C2. Thereby, by injecting fluid into the first fluid chamber C1 and/or the second fluid chamber C2 to generate a pressure difference between the two chambers, the piston head 313 can be driven to have the pressing bar 312 executing the operations such as moving up or down, applying downward force, or removing downward force.

In addition, the exchangeable pressing module 3 provided in the present embodiment has a first fluid channel Fc1, a second fluid channel Fc2, and a third fluid channel Fc3. The pressing bar 312 has a negative pressure channel Vc and a chip pick-and-place hole Ph. One end of the negative pressure channel Vc is connected to the chip pick-and-place hole Ph, and another end of the negative pressure channel Vc is connected to a negative pressure fluid source Vs via the third fluid channel Fc3. One end of the first fluid channel Fc1 is connected to a positive pressure fluid source As, and another end of the first fluid channel Fc1 is connected to the first fluid chamber C1. One end of the second fluid channel Fc2 is connected to the positive pressure fluid source As, and another end of the second fluid channel Fc2 is connected to the second fluid chamber C2. Thereby, the (positive pressure) gas or liquid provided by the positive pressure fluid source As can be injected into the first fluid chamber C1 and the second fluid chamber C2 through the first fluid channel Fc1 and the second fluid channel Fc2 respectively, and the negative pressure fluid source Vs is capable to generate a negative pressure fluid environment in the chip pick-and-place hole Ph through the third fluid channel Fc3 and the negative pressure channel Vc for picking or placing the electronic device C.

Moreover, in the present embodiment, the cross-section area of the second fluid chamber C2 is greater than the cross-section area of the first fluid chamber C1. By injecting a fluid with the same pressure as that injected into the first fluid chamber C1 (i.e. a specific pressure) into the second fluid chamber C2, the second fluid chamber C2 would be expanded to generate an upward force to have the pressing bar 312 moving up; on the other hand, the positive pressure of the fluid in the second fluid chamber C2 may be taken off to have the pressure declined below the specific pressure to have the pressing bar 312 moving down. Furthermore, because the positive pressure fluid source of the ordinary production line only output a fluid with a single fixed pressure (i.e. the specific pressure in the present embodiment), the different cross-section areas of the first fluid chamber C1 and the second fluid chamber C2 specified in the present embodiment are capable to generate stage forces even under the same fluid pressure source.

As mentioned, the major purpose of the aforementioned arrangement is that, by keeping the fluid within the first fluid chamber C1 at a specific pressure, a predetermined working pressure (the downward force) can be generated beforehand. Thereby, in each testing operation, it is not needed to wait for the fluid pressure in the first fluid chamber C1 reaching the specific pressure because the fluid pressure is kept at the working pressure, and what the operation needs is to apply or remove the positive pressure in the second fluid chamber C2 to have the pressing bar 312 moving up or down quickly. Thus, in addition to a steady downward force, the motion switching speed of the pressing bar 312 would be fast. It is also understood that in order to achieve the purpose of upward and downward motions, some fluid control components such as the pressure relief valve, the fluid distributor, the fluid control valve, and the equivalent thereof may be disposed in the aforementioned fluid channels.

The operation process of the present embodiment is described below. Firstly, the load carrying device 4 drives the modular pressing device 1 to an area or a chip tray (not shown) to pick an electronic device C to be tested and carries the electronic device C to the position above the testing seat S (not shown). Thereafter, the load carrying device 4 moves down to have the modular pressing device 1 contact the testing seat S. At this time, the load carrying device 4 would keep moving down to compress a damper, which is utilized as the first downward force generating unit 21, to generate a first downward force F1 applied to the testing seat S so as to guarantee that the modular pressing device 1 is firmly attached to the testing seat S.

Thereafter, the pressing bar 312 presses the electronic device C, and the second downward force generating unit 31 applies a second downward force F2 to the electronic device C to have the electronic device C electrically contact the plurality of probes P of the testing seat S. In this step, the positive pressure in the second fluid chamber C2 is taken off, i.e. the positive pressure is discharged to have the fluid pressure in the second fluid chamber C2 smaller than the specific pressure, to have the pressing bar 312 pressing the electronic device C so as to have the second downward force F2 generated by the second downward force generating unit 31 applied to the electronic device C directly.

Afterward, the testing process is executed. After the testing process is completed, the pressing bar 312 is lifted to detach the electronic device C from the testing seat S. In detail, in this step, a fluid (e.g. air in the present embodiment) is injected into the second fluid chamber C2 to recover the positive pressure in the second fluid chamber C2, i.e. enhanced to the pressure equal or greater than the specific pressure. However, because the cross-section area of the second fluid chamber C2 is set to be greater than the cross-section area of the first fluid chamber C1 in accordance with the present embodiment, the fluid injected into the second fluid chamber C2 would generate a force to push the piston head 313 upward so as to drive the pressing bar 312 together with the electronic device C moving upward to have the electronic device C detached from the testing seat S.

Thereafter, the load carrying device 4 lifts the modular pressing device 1 to remove the first downward force F1 and have the modular pressing device 1 detached from the testing seat S. Finally, the load carrying device 4 carries the electronic device C to the qualified chip tray or the disqualified chip tray (not shown) according to the testing result.

Figure 3:
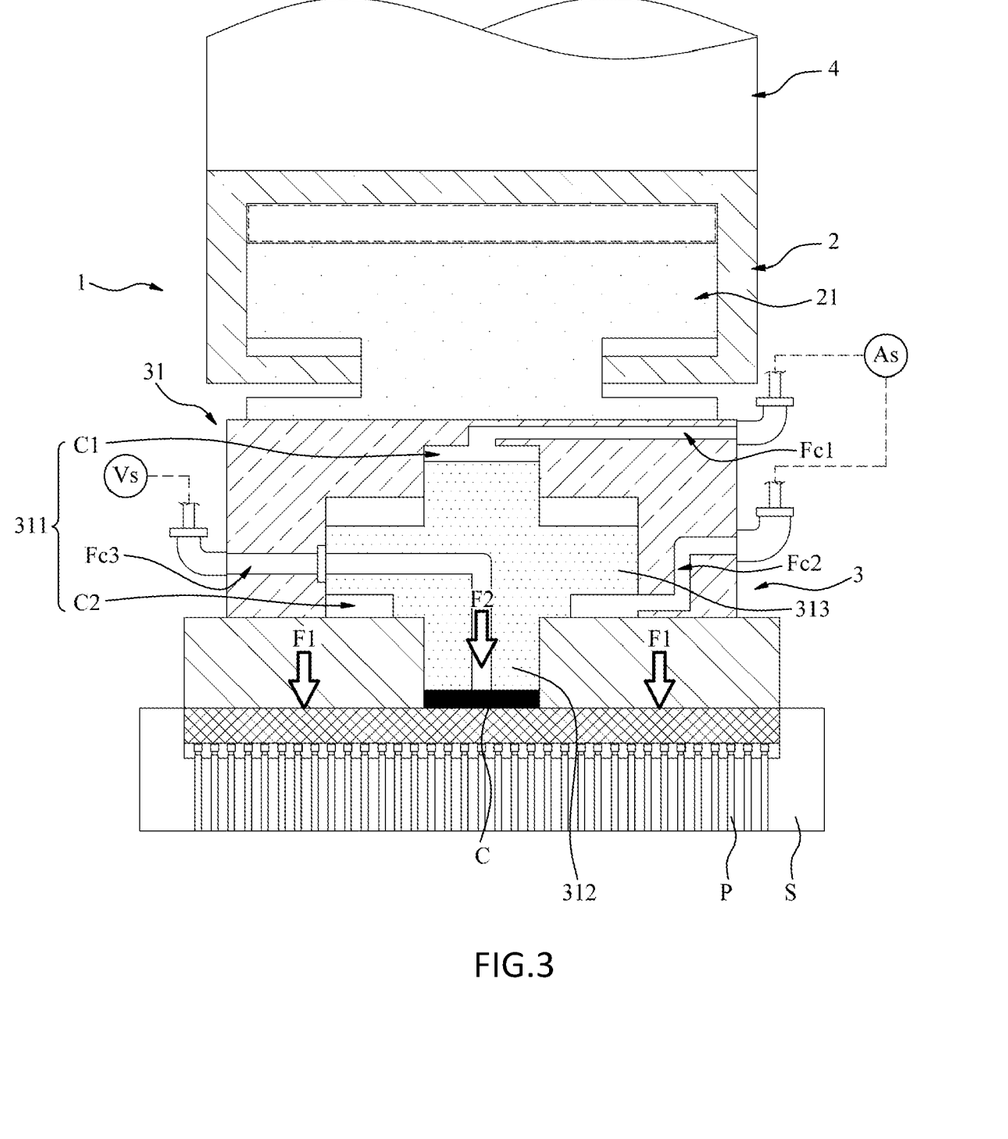
FIG. 3 is a schematic cross-section view of the electronic device testing apparatus provided in accordance with another embodiment of the present invention.

Please also refer to FIG. 3, which is a schematic cross-section view of the electronic device testing apparatus provided in accordance with another embodiment of the present invention. The major difference between the present embodiment and the previous embodiment is the testing object. In the present embodiment, as shown in FIG. 3, the testing object in the electronic device C with the printed circuit board and the die. That is, the electronic device C includes a semiconductor component region (i.e. the die) and a circuit board region (i.e. the printed circuit board). The downward force applied to the die should be carefully controlled because the integrated circuit on the die is quite precise and fragile.

However, in the present embodiment, the modular pressing device 1 presses against the circuit board region of the electronic device C, whereas the pressing bar 312 merely presses against the semiconductor component region of the electronic device C. In other words, the first downward force generating unit 21 of the present embodiment has the modular pressing device 1 applying the first downward force F1 to the circuit board region to have all the joints in the circuit board region electrically contact the plurality of probes P of the testing seat S. The second downward force generating unit 31 has the pressing bar 312 moving down and applying the second downward force F2 to the semiconductor component region to guarantee that all the joints on the lower surface of the electronic device C electrically contact the probes P of the testing seat S.

Figure 4:
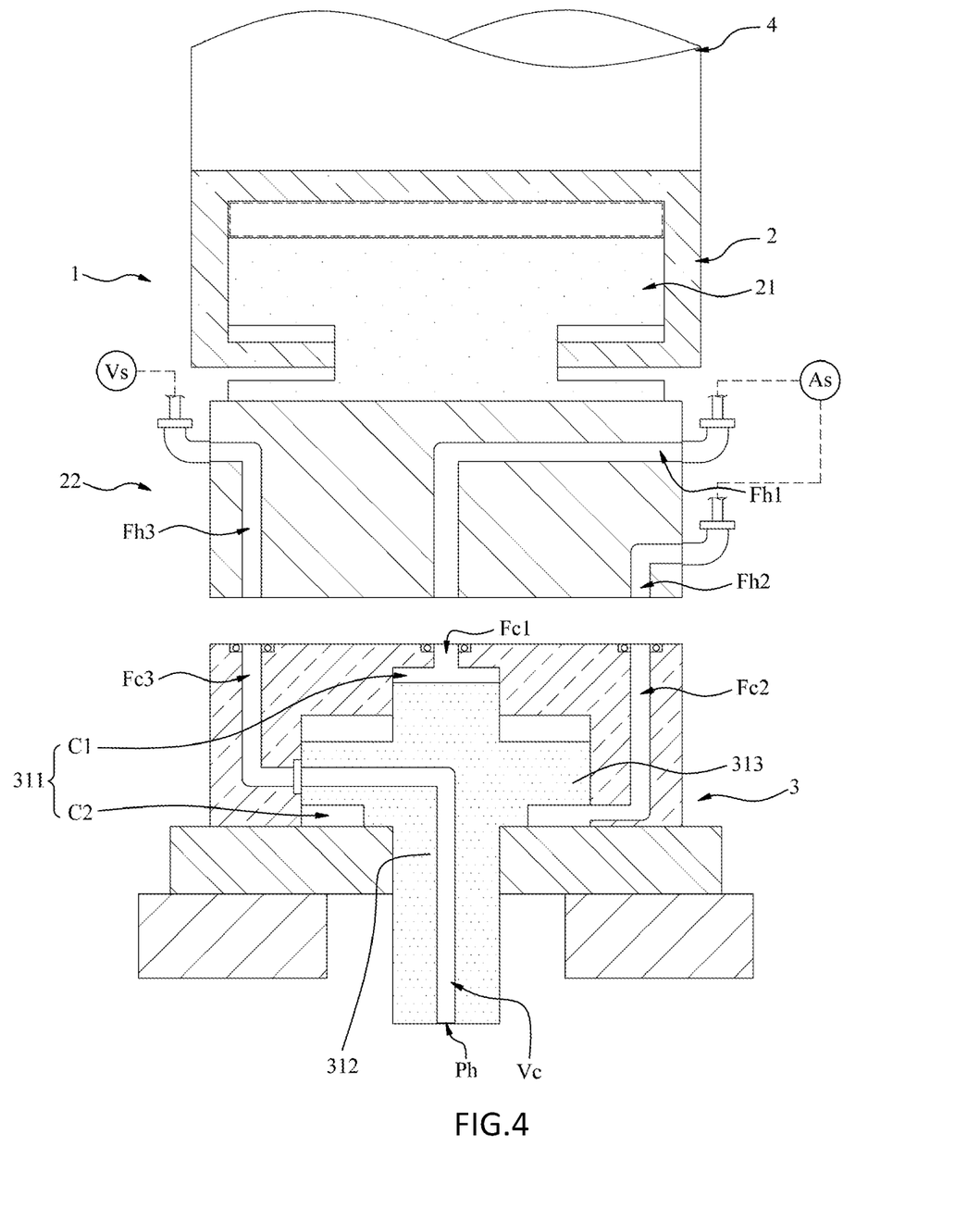
FIG. 4 is a schematic cross-section view of the modular pressing device capable of generating stage downward forces provided in accordance with a second embodiment of the present invention.

Please also refer to FIG. 4, which is a schematic cross-section view of the modular pressing device capable of generating stage downward forces provided in accordance with a second embodiment of the present invention. The major difference between the present embodiment and the pressing device described in the aforementioned first embodiment is that, the non-exchangeable pressing module 2 of the present embodiment further includes a connection head 22. One end of the connection head 22 is connected to the first downward force generating unit 21, and the exchangeable pressing module 3 is detachably assembled to another end of the connection head 22. In other words, the additional connection head 22 provided in the present embodiment has the function similar to an adaptor interface for connecting the exchangeable pressing modules 3 of different dimensions to the testing apparatus or detaching the exchangeable pressing modules 3 from the testing apparatus easily.

Moreover, the connection head 22 provided in the present embodiment may comprise a first fluid runner Fh1, a second fluid runner Fh2, and a third fluid runner Fh3. The exchangeable pressing module 3 further comprises a first fluid channel Fc1, a second fluid channel Fc2, and a third fluid channel Fc3. The pressing bar 312 further comprises a negative pressure channel Vc and a chip pick-and-place hole Ph. One end of the negative pressure channel Vc is connected to the chip pick-and-place hole Ph, and another end of the negative pressure channel Vc is connected to a negative pressure fluid source Vs via the third fluid channel Fc3 and the third fluid runner Fh3. One end of the first fluid channel Fc1 is connected to a positive pressure fluid source As via the first fluid runner Fh1, and another end thereof is connected to the first fluid chamber C1. One end of the second fluid channel Fc2 is connected to the positive pressure fluid source As via the second fluid runner Fh2, and another end thereof is connected to the second fluid chamber C2.

In short, the connection head 22 can be utilized for assembling the exchangeable pressing module 3, and all the gas inlets are disposed on the connection head 22. The gas may be injected into the fluid chambers via the fluid runners of the connection head 22 and the fluid channels of the exchangeable pressing module 3, and a negative pressure may be generated at the chip pick-and-place hole for taking the chip.

Figure 5:
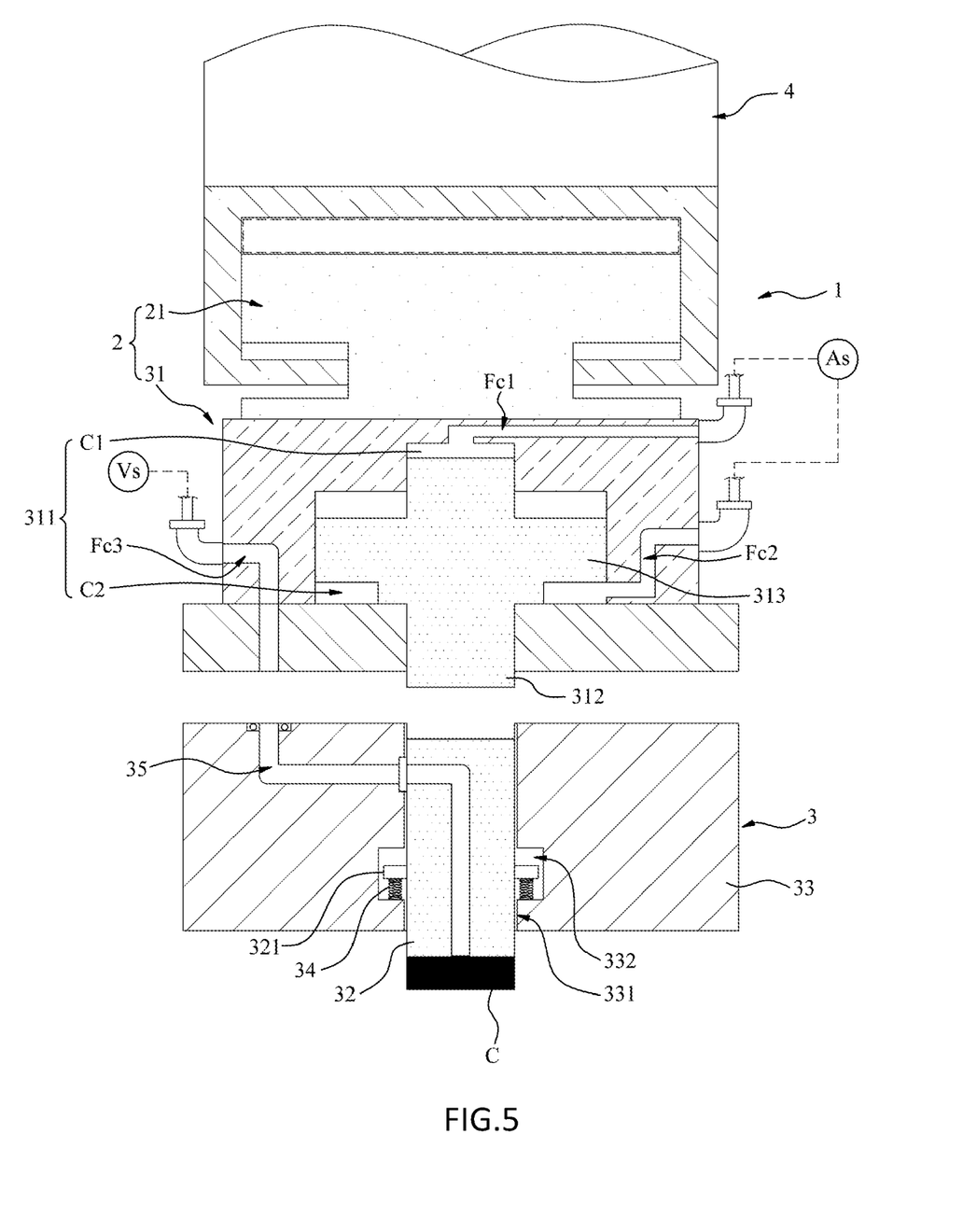
FIG. 5 is a schematic cross-section view of the modular pressing device capable of generating stage downward forces provided in accordance with a third embodiment of the present invention.

Please refer to FIG. 5, which is a schematic cross-section view of the modular pressing device capable of generating stage downward forces provided in accordance with a third embodiment of the present invention. The major difference between the present embodiment and the aforementioned embodiments is that, in the present embodiment, both the first downward force generating unit 21 and the second downward force generating unit 31 are disposed on the non-exchangeable pressing module 2, and the exchangeable pressing module 3 includes a chip pick-and-place bar 32, a pressing block 33, and two reset elastic elements 34. The pressing block 33 is detachably assembled to the non-exchangeable pressing module 2. The pressing block 33 has a through hole 331. The chip pick-and-place bar 32 penetrates the through hole 331. One end of the chip pick-and-place bar 32 is connected to the pressing bar 312 of the second downward force generating unit 31, and another end thereof is utilized for pressing the electronic device C.

In addition, as shown in the figure, the through hole 311 includes two radial concaves 332, the chip pick-and-place bar 32 further includes two radial protrusions 321 placed in the two radial concaves 332. Moreover, the two reset elastic elements 34 are located in the two radial concaves 332 and press against the radial protrusions 321 of the chip pick-and-place bar 32. Thereby, after the second downward force F2 is removed from the non-exchangeable pressing module 2, the elastic recovery force provided by the reset elastic elements 34 may push the chip pick-and-place bar 32 upward to the original position.

In addition, regarding the fluid channel design of the present embodiment, the channel for injecting the positive pressure fluid, i.e. the first fluid channel Fc1 and the second fluid channel Fc2, are disposed in the non-exchangeable pressing module 2 together with the second downward force generating unit 31. Other than that, the non-exchangeable pressing module 2 also has a third fluid channel Fc3, which is utilized for connecting a negative pressure fluid source Vs. Moreover, the negative pressure channel Vc and the chip pick-and-place hole Ph are disposed on the chip pick-and-place bar 32, and the pressing block 33 has an additional negative pressure connection channel 35. One end of the negative pressure channel Vc is connected to the chip pick-and-place hole Ph, and another end of the negative pressure channel Vc is connected to the negative pressure fluid source Vs via the negative pressure connection channel 35 and the third fluid channel Fc3.

Thereby, the present embodiment has all the fluid inlets and channels disposed on the non-exchangeable pressing module 2 except the negative pressure connection channel 35 and the negative pressure channel Vc for connecting the negative pressure fluid source Vs, which are disposed on the exchangeable pressing module 3 and the chip pick-and-place bar 32 respectively, such that the arrangement of fluid pipelines can be simplified.

It should be mentioned that, in the aforementioned embodiments, the second downward force F2 is smaller than the first downward force F1, however, the scope of the present invention is not limited thereto. The first downward force F1 and the second downward force F2 can be adjusted according to the need in practice to have the second downward force F2 equal to or greater than the first downward force F1. In addition, although only the way for applying two different downward forces are described in the aforementioned embodiments, however, the scope of the present invention is not limited thereto. The technology provided in the present invention can also be applied for generating three or more stage forces.

While the present invention has been particularly shown and described with reference to a preferred embodiment, it will be understood by those skilled in the art that various changes in form and detail may be without departing from the spirit and scope of the present invention.

What is claimed is:

1. A modular pressing device capable of generating stage downward forces, comprising:
    a non-exchangeable pressing module, disposed on an electronic device testing apparatus, and the non-exchangeable pressing module including a first downward force generating unit; and
    an exchangeable pressing module, assembled to the non-exchangeable pressing module, and the exchangeable pressing module including a second downward force generating unit,
    wherein, the first downward force generating unit applies a first downward force to at least one of a testing seat and an electronic device through the exchangeable pressing module, and the second downward force generating unit applies a second downward force to the electronic device,
    wherein the second downward force generating unit includes a fluid chamber and a pressing bar, the pressing bar includes a piston head, the piston head is disposed in the fluid chamber to divide the fluid chamber into a first fluid chamber and a second fluid chamber, and the piston head is driven by injecting fluid into at least one of the first fluid chamber and the second fluid chamber to have the pressing bar moving up or down.

2. The modular pressing device capable of generating stage downward forces of claim 1, wherein the exchangeable pressing module further comprises a first fluid channel, a second fluid channel, and a third fluid channel, the pressing bar further comprises a negative pressure channel and a chip pick-and-place hole, one end of the negative pressure channel is connected to the chip pick-and-place hole, another end of the negative pressure channel is connected to a negative pressure fluid source via the third fluid channel, one end of the first fluid channel is connected to a positive pressure fluid source, another end of the first fluid channel is connected to the first fluid chamber, one end of the second fluid channel is connected to the positive pressure fluid source, and another end of the second fluid channel is connected to the second fluid chamber.

3. The modular pressing device capable of generating stage downward forces of claim 1, wherein the non-exchangeable pressing module further comprises a connection head, one end of the connection head is connected to the first downward force generating unit, and the exchangeable pressing module is distachably assembled to another end of the connection head.

4. The modular pressing device capable of generating stage downward forces of claim 3, wherein the connection head comprises a first fluid runner, a second fluid runner, and a third fluid runner, the exchangeable pressing module further comprises a first fluid channel, a second fluid channel, and a third fluid channel, the pressing bar further comprises a negative pressure channel and a chip pick-and-place hole, one end of the negative pressure channel is connected to the chip pick-and-place hole, another end of the negative pressure channel is connected to a negative pressure fluid source via the third fluid channel and the third fluid runner, one end of the first fluid channel is connected to a positive pressure fluid source via the first fluid runner, another end of the first fluid channel is connected to the first fluid chamber, one end of the second fluid channel is connected to the positive pressure fluid source via the second fluid runner, and another end of the second fluid channel is connected to the second fluid chamber.

5. The modular pressing device capable of generating stage downward forces of claim 1, wherein the modular pressing device is disposed on a load carrying device, the load carrying device moves the electronic device carried by the modular pressing device to the testing seat, the modular pressing device presses the electronic device to have the electronic device installed in the testing seat, and the testing seat tests the electronic device.

6. A modular pressing device capable of generating stage downward forces, comprising:
    a non-exchangeable pressing module, including a first downward force generating unit and a second downward force generating unit; and
    an exchangeable pressing module, assembled to the non-exchangeable pressing module, the exchangeable pressing module including a chip pick-and-place bar, and the chip pick-and-place bar connected to the second downward force generating unit,
    wherein the first downward force generating unit applies a first downward force to at least one of a testing seat and an electronic device through the exchangeable pressing module, and the second downward force generating unit applies a second downward force to the electronic device through the chip pick-and-place bar,
    wherein the second downward force generating unit includes a fluid chamber and a pressing bar, the pressing bar includes a piston head, the piston head is disposed in the fluid chamber to divide the fluid chamber into a first fluid chamber and a second fluid chamber, the chip pick-and-place bar is connected to the pressing bar, and the piston head is driven by injecting fluid into at least one of the first fluid chamber and the second fluid chamber to have the pressing bar moving up or down.

7. The modular pressing device capable of generating stage downward forces of claim 6, wherein the non-exchangeable pressing module further comprises a first fluid channel, a second fluid channel, and a third fluid channel, the exchangeable pressing module further comprises a negative pressure connection channel, the chip pick-and-place bar further comprises a negative pressure channel and a chip pick-and-place hole, one end of the negative pressure channel is connected to the chip pick-and-place hole, another end of the negative pressure channel is connected to a negative pressure fluid source via the negative pressure connection channel and the third fluid channel, one end of the first fluid channel is connected to a positive pressure fluid source, another end of the first fluid channel is connected to the first fluid chamber, one end of the second fluid channel is connected to the positive pressure fluid source, and another end of the second fluid channel is connected to the second fluid chamber.

8. The modular pressing device capable of generating stage downward forces of claim 6, wherein the exchangeable pressing module comprises a pressing block and at least one reset elastic element, the pressing block has a through hole, the chip pick-and-place bar penetrates the through hole, the through hole includes at least one radial concave, the chip pick-and-place bar includes at least one radial protrusion placed in the at least one radial concave, the at least one reset elastic element is located in the at least one radial concave and presses against the at least one radial protrusion of the chip pick-and-place bar, and as the chip pick-and-place bar moves up or down, the at least one reset elastic element forces the chip pick-and-place bar back to an original position.

9. The modular pressing device capable of generating stage downward forces of claim 6, wherein the modular pressing device is disposed on a load carrying device, the load carrying device moves the electronic device carried by the modular pressing device to the testing seat, the modular pressing device presses the electronic device to have the electronic device installed in the testing seat, and the testing seat tests the electronic device.

* * * * *